(12) United States Patent
Hanna et al.

(10) Patent No.: US 7,256,064 B2
(45) Date of Patent: Aug. 14, 2007

(54) ORGANIC SEMICONDUCTOR DEVICE

(75) Inventors: Junichi Hanna, Yokohama (JP); Hiroki Maeda, Tokyo (JP); Akihiko Nakasa, Tokyo (JP); Hidehiro Nakagawa, Tokyo (JP)

(73) Assignee: Dai Nippon Printing Co. Ltd., Tokyo (JP)

( * ) Notice: Subject to any disclaimer, the term of this patent is extended or adjusted under 35 U.S.C. 154(b) by 45 days.

(21) Appl. No.: 11/092,184

(22) Filed: Mar. 29, 2005

(65) Prior Publication Data

US 2006/0054883 A1    Mar. 16, 2006

(30) Foreign Application Priority Data

Mar. 31, 2004  (JP)  .............................. 2004-134881

(51) Int. Cl.
*H01L 21/00*  (2006.01)
(52) U.S. Cl. ......................................... 438/82; 438/99
(58) Field of Classification Search .................. 438/82, 438/99; 257/40; 428/690; 313/499–509
See application file for complete search history.

(56) References Cited

U.S. PATENT DOCUMENTS 7,050,697 B1 *  5/2006  Stevenson .................... 385/147

\* cited by examiner

*Primary Examiner*—Hsien-Ming Lee
(74) *Attorney, Agent, or Firm*—Timothy J. Keefer; Seyfarth Shaw LLP

(57) ABSTRACT

The present invention provides an organic semiconductor device comprising an organic semiconductor layer having good charge carrier transport property, wherein a carrier injection to the organic semiconductor layer is easy. The above problem is solved by an organic semiconductor device comprising a first electrode and a second electrode facing to each other, and an organic semiconductor layer provided in between the first electrode and the second electrode, wherein a charge carrier injection promoting layer is formed in between the organic semiconductor layer and at least one electrode of the first electrode and the second electrode.

15 Claims, 5 Drawing Sheets

ORGANIC SEMICONDUCTOR DEVICE

BACKGROUND OF THE INVENTION

1. Field of the Invention

The present invention relates to an organic semiconductor device. Particularly, the present invention relates to an organic semiconductor device comprising an organic semiconductor layer containing a liquid crystalline organic semiconductor material having excellent charge carrier mobility.

2. Description of the Related Art

FIG. 8 is a sectional view showing one example of a conventional organic semiconductor device. A conventional organic semiconductor device 100 comprises a substrate 101, a gate electrode 102, a gate-insulating layer 103, an organic semiconductor layer 104, a source electrode 105 and a drain electrode 106. In the organic semiconductor device having such configuration, the organic semiconductor layer is required to have sufficient charge carrier mobility. Therefore, the organic semiconductor material having high charge carrier mobility is being investigated recently.

As a material having high charge carrier mobility, a liquid crystalline organic semiconductor material is known. For example, by Haarer et al., it is reported that a high carrier mobility of $10^{-1}$ cm$^2$/V·s is obtained in meso phase of a long chain triphenylene based compound, which is a typical liquid crystalline organic semiconductor material (for example, see Nature, Vol. 371, p. 141 (1994)). And by Hanna et al., it is reported that a smectic E (SmE) phase of rod-shaped liquid crystal material having phenylnaphthalene skeleton exhibits high charge carrier mobility of $10^{-2}$ cm$^2$/V·s (for example, see Appl. Phys. Lett., Vol. 73, No. 25, p. 3733 (1998)). These liquid crystalline organic semiconductor materials are expected as film-forming material constituting a channel region for an organic semiconductor element.

SUMMARY OF THE INVENTION

In the above-described organic semiconductor layer having high charge carrier mobility, it is required, as a premise, sufficient quantity of charge (hole, electron) is supplies (injected) to the organic semiconductor layer effectively and swiftly. However, since there is a large energy gap between the organic semiconductor layer and the source electrode supplying the charge, there is a problem that the charge is not injected to the organic semiconductor layer easily.

On the other hand, in a field of an organic electroluminescence (hereinafter, referred to as organic EL), as described in Japanese Patent Application Laid-open (JP-A) No. 2002-270369, an organic EL element is reported in which an organic thin film having dipole moment having electric double layer effect is formed, as a hole injection promoting layer, on a light emitting layer side surface of an anode. This report describes an accomplishment of lowering operating voltage by making the energy gap between the electrode and the light emitting layer, by a function of the organic thin film having dipole moment, so that the hole injection from the anode to the light emitting layer is made easy. Moreover, as described in Tokuhyou No. 2001-5122145, the organic EL element is reported in which the organic thin film comprising a dipole compound having functional group such as π-electron system, is formed, as the hole injection promoting layer, on the light emitting layer side surface of the anode. In this report, it is described that the charge injection from the electrode to the light emitting layer is made easy because the organic thin film acts as the electric double layer which makes the energy gap between the electrode and the light emitting layer smaller.

The present invention is achieved in order to solve the above-described problems in the organic semiconductor device. The object is to provide the organic semiconductor device comprising the organic semiconductor layer having good carrier transport property, wherein the charge carrier injection to the organic semiconductor layer is easy.

To solve the above-described problems, the organic semiconductor device of the present invention is an organic semiconductor device comprising a first electrode and a second electrode facing to each other, and an organic semiconductor layer provided in between the first electrode and the second electrode, wherein a charge carrier injection promoting layer is formed in between the organic semiconductor layer and at least one electrode of the first electrode and the second electrode.

In the present invention, since the charge carrier injection promoting layer is formed in between the organic semiconductor layer and at least one electrode of the first electrode and the second electrode, charge injection to the organic semiconductor layer is made easy by the function of the charge carrier injection promoting layer.

In the organic semiconductor device of the present invention, it is preferable that the organic semiconductor layer is formed from a liquid crystalline organic semiconductor material.

In this invention, since the organic semiconductor layer is formed from the liquid crystalline organic semiconductor material, it is possible to form the organic semiconductor layer having high charge carrier mobility.

In the organic semiconductor device of the present invention, it is preferable that the liquid crystalline organic semiconductor material comprises a liquid crystal molecule shown in a following chemical formula 1.

   1

(Wherein A in the above chemical formula represents a core part having skeletal structure comprising L-unit of 6π-electron system ring, M-unit of 8π-electron system ring, N-unit of 10π-electron system ring, O-unit of 12π-electron system ring, P-unit of 14π-electron system ring, Q-unit of 16π-electron system ring, R-unit of 18π-electron system ring, S-unit of 20π-electron system ring, T-unit of 22π-electron system ring, U-unit of 24π-electron system ring and V-unit of 26π-electron system ring (Wherein L, M, N, O, P, Q, R, S, T, U and V each represent an integer of 0 to 12, and L+M+N+O+P+Q+R+S+T+U+V=1 to 12.), and B and B' in the above chemical formula represent a chain structure with high flexibility or functional group such as hydrogen and halogen.)

In this invention, the liquid crystal molecules exist so that the skeletal structures thereof are adjacent and chain molecules, thereof exist so that they are adjacent. Therefore, the region where the skeletal structures are adjacent will be a molecular aggregating part high self-assembling property. As a result, in the molecular aggregating part, hopping conduction of electron and hole easily occurs. Therefore, the organic semiconductor layer formed from the liquid crystalline organic semiconductor material having such liquid crystal molecule has high charge carrier mobility.

In the organic semiconductor device of the present invention, it is preferable that the liquid crystalline organic semiconductor material has at least one of a thermotropic liquid crystal phase and a lyotropic liquid crystal phase.

In the organic semiconductor device of the present invention, it is preferable that the thermotropic liquid crystal phase is a smectic liquid crystal phase.

In the organic semiconductor device of the present invention, it is preferable that the organic semiconductor layer exhibits a charge carrier mobility of $10^{-6}$ cm$^2$/V·s or higher.

In the organic semiconductor device of the present invention, it is preferable that the charge carrier injection promoting layer is an organic thin film having a dipole moment.

In this invention, since the charge carrier injection promoting layer is the organic thin film having a dipole moment, a difference between a work function of the electrode and a work function of the organic semiconductor layer can be made smaller (that is, a charge carrier injection barrier existing in between the two can be made smaller). As a result, by the function of the organic thin film, the charge carrier injection to the organic semiconductor layer is made easier.

In the organic semiconductor device of the present invention, it is preferable that: (A) the charge carrier injection promoting layer is formed from an organic compound having an electric dipole moment represented by a vector having an absolute value of 1 Debye or higher and 50 Debye or lower, and a direction of the vector is directed such that a positive electrode of the organic compound is placed at a hole injecting electrode side, among the first electrode and the second electrode, and a negative electrode of the organic compound is placed at the organic semiconductor layer side; and (B) the charge carrier injection promoting layer is formed from an organic compound having an electric dipole moment represented by a vector having an absolute value of 1 Debye or higher and 50 Debye or lower, and a direction of the vector is directed such that a negative electrode of the organic compound is placed at an electron injecting electrode side, among the first electrode and the second electrode, and a positive electrode of the organic compound is placed at the organic semiconductor layer side.

In these inventions, the organic thin film (charge carrier infection promoting layer) having dipole moment is formed by chemically bonding the organic compound, having the electric dipole moment, to the electrode to which the charge is injected. Therefore, the charge injection from such electrode to the organic semiconductor layer can be promoted easily.

In the organic semiconductor device of the present invention, it is preferable that the charge carrier injection promoting layer is an organic thin film comprising either one of an organic compound shown in a following chemical formula 44 and an organic compound shown in a chemical formula 46.

44

46

(In formula 44 and formula 46, Ar represents an aromatic hydrocarbon ring or an aromatic heterocyclic ring, Y and Y' represent a linking group to a reactive group existing in the electrode or near the electrode, and X and X' represent a substitutional group.)

In the organic semiconductor device of the present invention, it is preferable that the first electrode is a source electrode; the second electrode is a drain electrode; the organic semiconductor layer is formed in a channel region in between the source electrode and the drain electrode; and further comprising a substrate, a gate electrode, and a gate-insulating layer.

In the organic semiconductor device of the present invention, it is preferable that the source electrode and the drain electrode are formed on the substrate, and the charge carrier injection promoting layer is formed: on at least one electrode of the source electrode and the drain electrode; or in the channel region near at least one electrode of the source electrode and the drain electrode.

In the organic semiconductor device of the present invention, it is preferable that the substrate is a first electrode substrate on which the source electrode is formed, further comprising a second electrode substrate on which the drain electrode is formed, and the first electrode substrate and the second electrode substrate are provided so that they face to each other, and the charge carrier injection promoting layer is formed: on at least one electrode of the source electrode and the drain electrode; or in the channel region near at least one electrode of the source electrode and the drain electrode.

According to the organic semiconductor device of the present invention, since the charge carrier injection promoting layer is provided in between the organic semiconductor layer and at least one electrode of the first electrode and the second electrode facing to each other, the charge carrier injection to the organic semiconductor layer is made easy. As a result, the charge carrier, which is sufficient in quantity for carrier mobility, is supplied to the organic semiconductor layer effectively and swiftly. Particularly, since sufficient quantity of charge is supplied to the organic semiconductor layer formed from the liquid crystalline organic semiconductor material, the organic semiconductor device having such organic semiconductor layer can transfer a lot of charge at high speed.

DESCRIPTION OF THE PREFERRED EMBODIMENT

The organic semiconductor device of the present invention, comprises facing first electrode and a second electrode, and an organic semiconductor layer provided in between the first electrode and the second electrode, wherein a charge carrier injection promoting layer is formed in between the organic semiconductor layer and at least one electrode of the first electrode and the second electrode.

Hereinafter, the organic semiconductor device of the present invention is described in detail referring to an organic transistor element as an example.

Figure 1:
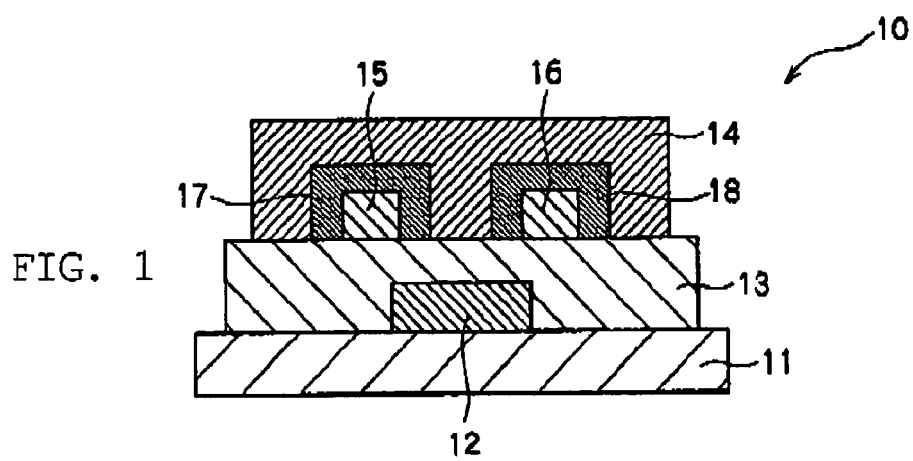
FIG. 1 is a sectional view showing one example of the organic semiconductor device of the present invention.

FIG. 1 is a frame format sectional view showing one example of layer configuration of the organic semiconductor device (organic transistor element) of the present invention. As shown in FIG. 1, the organic semiconductor device (organic transistor element) 10 of the present invention has a coplanar structure constituted of, on the substrate 11, the gate electrode 12, gate-insulating layer 13, source electrode 15 and drain electrode 16, organic semiconductor layer 14 laminated in this order, and is characterized in that the charge carrier injection promoting layer is formed in between the organic semiconductor layer 14 and at least one electrode of the source electrode 15 and the drain electrode 16.

The organic semiconductor device 10 thus constituted is actuated in either one of an accumulated and empty state, depending on the polarity of voltage applied to the gate electrode 12. For example, when negative voltage is applied to the gate electrode, the electron in the organic semiconductor layer will be empty state, and the current flows due to the electron is transferred from the source electrode 15 to the drain electrode 16. Thus, a modulation of the current is possible by applying voltage to the gate electrode.

(Substrate)

The substrate 11 can be selected from a wide variety of insulating materials. Examples of such materials include: inorganic materials such as glass and calcined alumina; and various kinds of insulating materials such as polyimide film, polyester film, polyethylene film, polyphenylene sulfide film and polyparaxylene film. Particularly, a film comprising a polymer compound is extremely useful because it can be used to produce a lightweight and flexible organic semiconductor device. The thickness of substrate 11 used in the present invention is about 25 µm to 1.5 mm.

(Gate Electrode)

The gate electrode 12 is preferably an electrode consisting of an organic material such as polyaniline, polythiophene etc., or an electrode formed by coating conductive ink. Since these electrodes can be formed by coating organic material or the conductive ink, there is an advantage that the electrode formation process is very easy. Specific means of coating includes, in addition to spin coating method, casting method, dipping method, etc., printing methods such as ink jet printing method, screen-printing method, gravure printing method. A pattern printing can be carried out using these printing methods.

The electrode may be formed by conventional photolithography method. In this case, the following can be used as material for forming electrodes: metals such as gold, platinum, chromium, palladium, aluminum, indium, molybdenum, tantalum nickel and the like; alloys of these metal; and inorganic materials such as polysilicon, amorphous silicon, tin oxide, indium oxide, indium tin oxide (ITO) and the like. Two or more of these materials can be simultaneously used.

The thickness of the gate electrode is preferably about 50 to 1000 nm depending on the electric conductivity of its material. The lower limit of thickness of the gate electrode varies according to the electric conductivity of the electrode material and adhesion to a bedding substrate. The upper limit of thickness of the gate electrode should be in such a range that, upon providing the below-mentioned gate-insulating layer and a pair of source/drain electrodes, insulating coverage by the gate-insulating layer at a portion with a level difference, between the bedding substrate and the gate electrode, is sufficient. Also, it is necessary that an electrode pattern formed thereon should not be disconnected. Particularly, when a flexible substrate is used, stress balance should be taken into consideration.

(Gate-Insulating Layer)

The gate-insulating layer 13 is, similar to the gate electrode 12 described above, preferably formed by coating the organic based material. As the organic based material to be used, polychloropyrene, polyethyleneterephthalate, polyoxymethylene, polyvinyl chloride, polyvinylidene fluoride, cyanoethyl pullulan, polymethyl methacrylate, polysulfone, polycarbonate, polyvinylphenol, polystyrene, polyimide and the like can be listed. Specific means of coating includes, in addition to spin coating method, casting method, pulling method and the like, printing methods such as ink jet printing method, screen-printing method, gravure printing method, and flexo printing method. A pattern printing can be carried out by these printing methods.

Further, conventional patterning process such as CVD method can be used. In this case, inorganic materials such as $SiO_2$, $SiN_x$ and $Al_2O_3$ are preferably used. Two or more of these materials can be simultaneously used.

The gate-insulating layer 13 preferably has sufficient insulating property (that is, a leak current is small enough), and also, has large electrostatic capacity per unit volume. Thus, the thickness of the gate-insulting layer is set according to these two points of view. From these points of view, when the gate-insulating layer 13 is formed from the organic based material, the thickness of the gate-insulating layer 13 is preferably 50 to 300 µm. And when the gate-insulating layer is formed from the inorganic based material, the thickness is preferably 200 to 1000 µm. Further, when the gate-insulating layer 13 is formed from either of the material, withstand voltage is desirably 2 MV/cm or higher.

(Source Electrode and Drain Electrode)

The source electrode injects the charge carrier to the organic semiconductor layer, and the drain electrode takes the charge, which is injected from the source electrode, in.

The source electrode 15 and the drain electrode 16 are generally formed a metal such as aluminum, gold, silver, nickel, palladium and platinum, or a metallic oxide such as an oxide of indium and/or tin.

As forming methods for the source electrode 15 and the drain electrode 16, methods such as sputtering method and vacuum deposition method can be normally listed. Moreover, the source electrode 15 and the drain electrode 16 can be formed by a wet process such as coating method and dipping method. In this case, in addition to the above-described metals and metallic oxides, the layers are formed from a conductive paste such as carbon, or a conductive polymer. The thickness of the source electrode 15 and the drain electrode 16 is about 50 to 100 nm.

In conventional organic semiconductor device, from the view point of the charge carrier injection property, it is thought that the drain electrode is desirably formed from a material having large work function, and the source electrode is desirably formed from a material having small work function. However, in the organic semiconductor device of the present invention, since the work function of each electrode can be varied by providing the charge carrier injection promoting layer on these electrodes, the charge carrier injection property can be improved.

(Organic Semiconductor Layer)

As shown in FIG. 1, the organic semiconductor layer 14 is formed in the channel region (charge transport path region) in between the drain electrode 16 or the source electrode 15.

The organic semiconductor layer 14 is preferably formed from a liquid crystalline organic semiconductor material having high charge transfer property. Particularly, it is preferably that the organic semiconductor layer 14 is formed from the organic semiconductor material comprising liquid crystal molecule shown in the following chemical formula 1.

B-A-B'   1

(In the above chemical formula, A represents a core part having skeletal structure comprising L-unit of 6π-electron system ring, M-unit of 8π-electron system ring, N-unit of 10π-electron system ring, O-unit of 12π-electron system ring, P-unit of 14π-electron system ring, Q-unit of 16π-electron system ring, R-unit of 18π-electron system ring, S-unit of 20π-electron system ring, T-unit of 22π-electron system ring, U-unit of 24π-electron system ring and V-unit of 26π-electron system ring (Wherein L, M, N, O, P, Q, R, S, T, U and V each represent an integer of 0 to 12, and L+M+N+O+P+Q+R+S+T+U+V=1 to 12.). Moreover, B and B' in the above chemical formula represent a chain structure with high flexibility or functional group such as hydrogen and halogen.)

Referring to A of the liquid crystal molecule shown in the above chemical formula 1, the 6π-electron system ring includes, for example, a benzene ring, furan ring, thiophene ring, pyrrole ring, 2H-pyran ring, 4H-thiopyran ring, pyridine ring, oxazole ring, isoxazole ring, thiazole ring, isothiazole ring, furazane ring, imidazole ring, pyrazole ring, pyrazine ring, pyrimidine ring, pyridazine ring and troboron ring. The 8π-electron system ring includes, for example, a pentalene ring, indene ring, indolizine ring and 4H-quinoline ring. The 10π-electron system ring includes, for example, a naphthalene ring, azulene ring, benzofuran ring, isobenzofuran ring, 1-benzothiophene ring, 2-benzothiophene ring, indole ring, isoindole ring, 2H-chromene ring, 1H-2-benzopyran ring, quinoline ring, isoquinoline ring, 1,8-naphthyridine ring, benzimidazole ring, 1H-indazole ring, benzoxazole ring, benzothiazole ring, quinoxaline ring, quinazoline ring, cinnoline ring, pteridine ring, purine ring and phthalazine ring. The 12π-electron system ring includes, for example, a heptalene ring, biphenylene ring, as-indacin ring, s-indacin ring, acenaphthylene ring, fluorene ring and phenalene ring. The 14π-electron system ring includes, for example, a phenanthrene ring, anthracene ring, carbazole ring, xanthene ring, acridine ring, phenanthridine ring, pyrimidine ring, 1,10-phenanthroline ring, phenazine ring, phenarsazine ring and tetrathiafulvalene ring. The 16π-electron system ring includes, for example, a fluoranthene ring, acephenanthrylene ring, aceanthrylene ring, pyrene ring, thianthrene ring, phenoxathiine ring, phenoxazine ring and phenothiazine ring. The 18π-electron system ring includes, for example, a triphenylene ring, chrysene ring, naphthacene ring and pleiadene ring. The 20π-electron system ring includes, for example, a perylene ring. The 22π-electron system ring includes, for example, a piceine ring, pentaphene ring and pentacene ring. The 24π-electron system ring includes, for example, a tetraphenylene ring and coronene ring. The 26π-electron system ring includes, for example, a hexaphene ring, hexacene ring and rubicene ring.

As such skeletal structure having these electron system ring in a part of the structure, structures shown in the following chemical formulae 2 to 36 can be listed for examples.

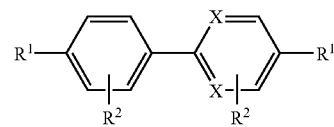

2

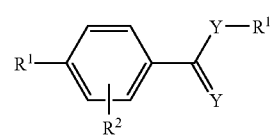

3

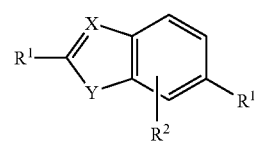

4

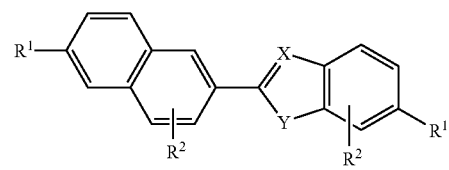

5

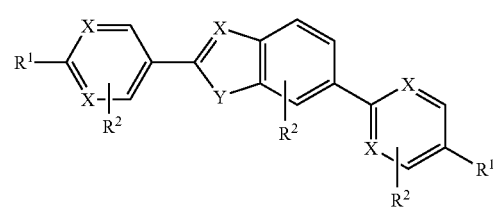

6

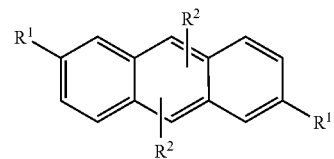

7

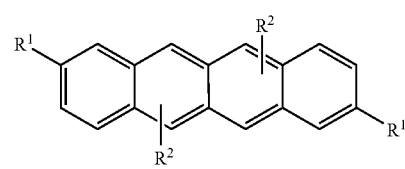

8

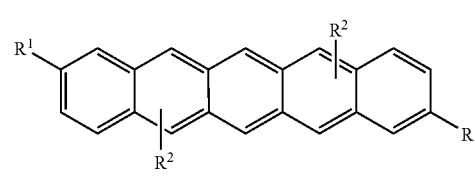

9

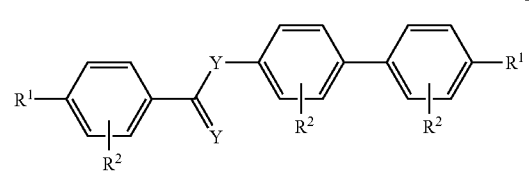

10

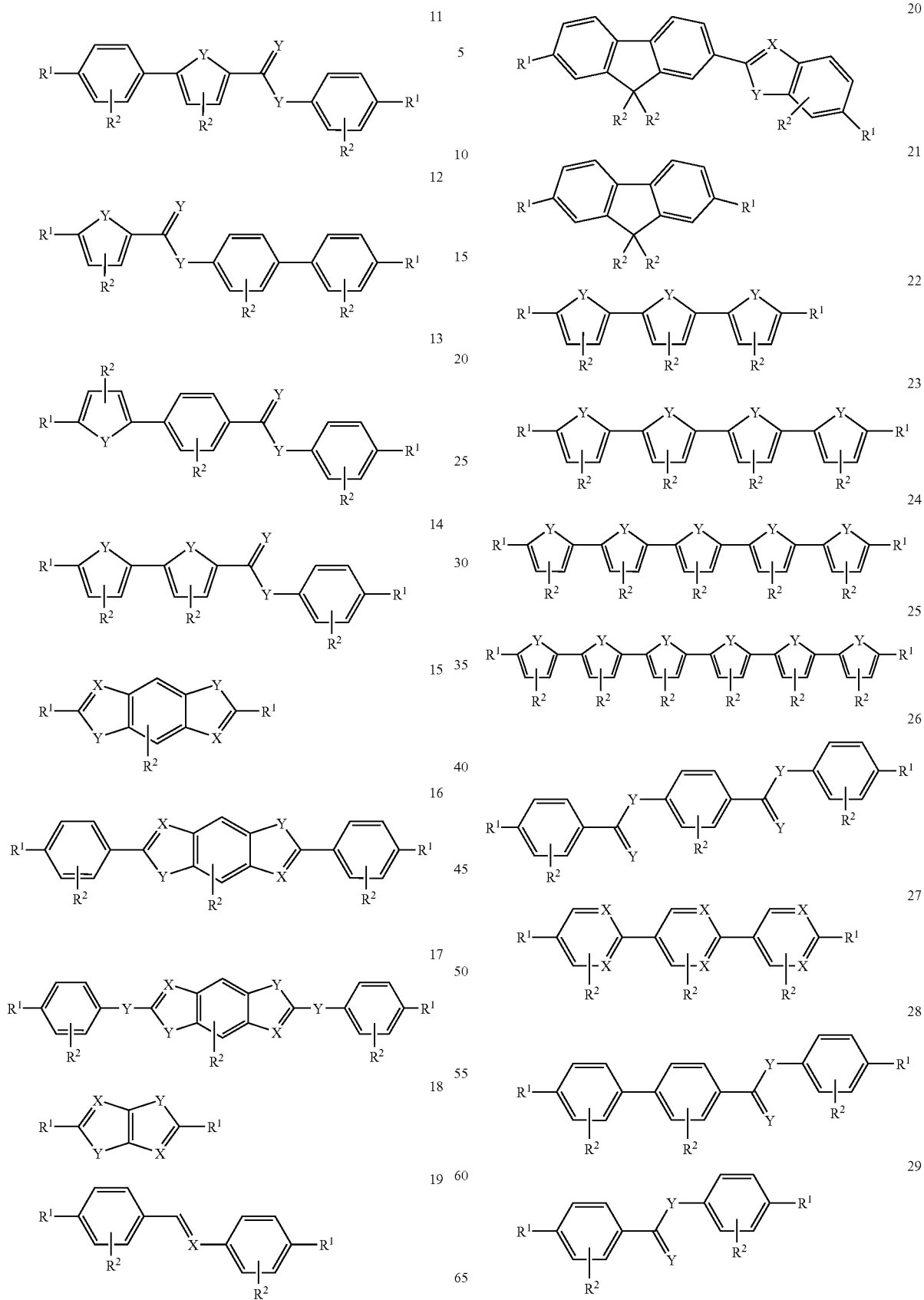

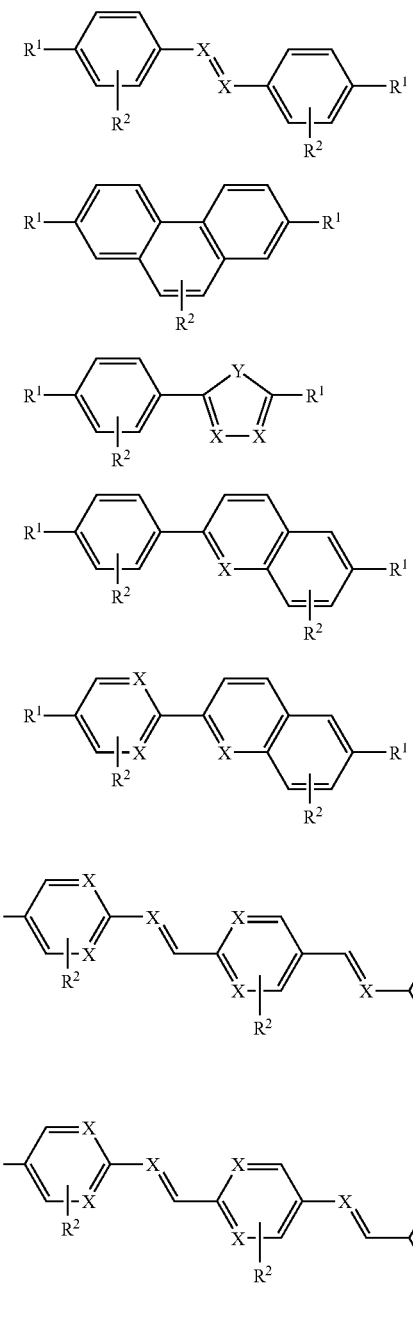

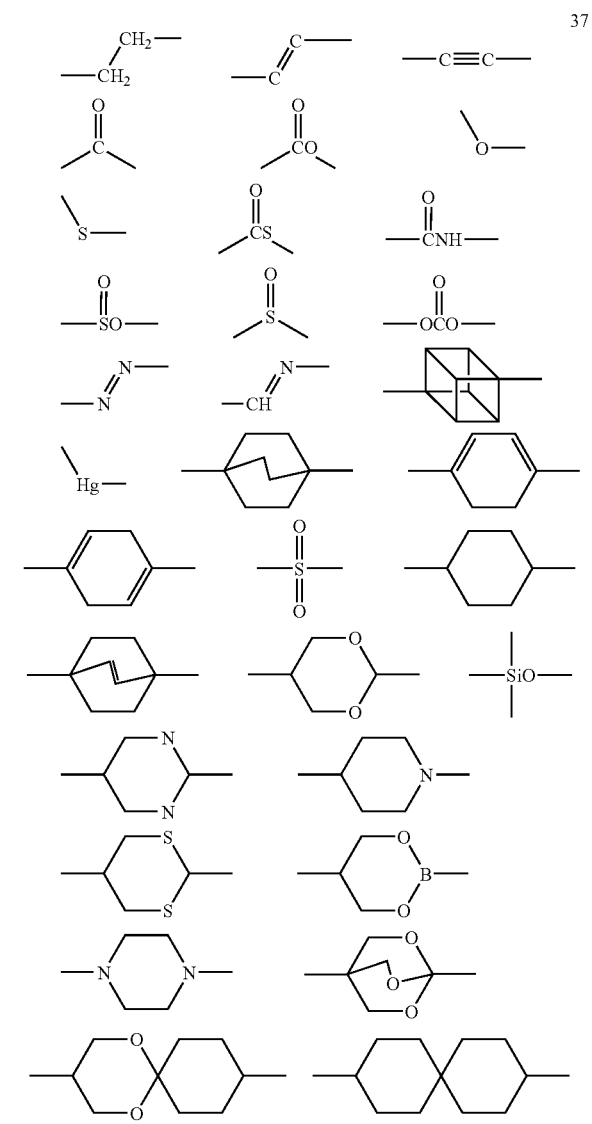

$R^1$ in the above chemical formulae 2 to 36 represents a divalent structure shown in the chemical formula 37 below, which is a linking group for linking with another skeleton. When a plurality of $R^1$s are present in these liquid crystal molecules, the $R^1$s may be the same or different. $R^1$ may not be present in the liquid crystal molecules. $R^2$ in the above chemical formulae 2 to 36 represents a functional group shown in the chemical formula 38 below. When a plurality of $R^2$s are present in these liquid crystal molecules, the $R^2$s may be the same or different. X in the above chemical formulae 2 to 36 represents CH or N, and Y in the above chemical formulae 2 to 36 represents S or O.

B and B' in the above chemical formula 1 is a chain structure with high flexibility or a functional group such as hydrogen and halogen. The chain structure with high flexibility is basically a linear alkyl chain or branched alkyl chain, and this alkyl chain may contain a structure selected from the group of 39 divalent structures shown in the chemical formula 37 below. The chain structure with high flexibility may be consisting of structures selected from the group of 39 divalent structures shown in the chemical formula 37 below. In this case, the chain structure with high flexibility may be composed of one structure selected from the group, or may be composed of a plurality of structures, which are selected from the group, linked in a linear or branched form. These chain structures with high flexibility may have a functional group selected from the group of 21 functional groups illustrated as substitutional groups in the chemical formula 38 below. In cases in which B and B' in the above chemical formula 1 do not have the chain structure with high flexibility, they will be one of the 21 functional groups shown in the chemical formula 38 below.

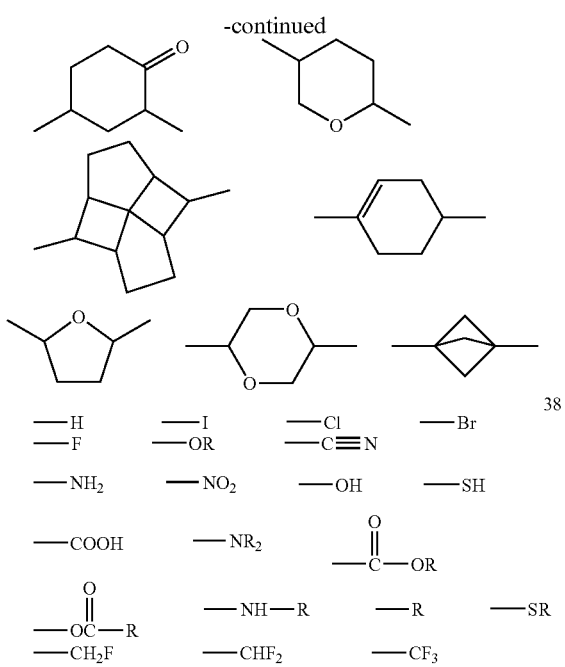

R in the above chemical formula 38 represents linear or branched alkyl group of 1 to 40 carbon atoms.

For the liquid crystalline organic semiconductor material of the present invention, among the liquid crystal molecules shown in the above chemical formula 1, ones that have at least one kind of liquid crystal state, at a temperature of not higher than the thermal decomposition temperature thereof, are used. The phrase "at a temperature of not higher than the thermal decomposition temperature thereof" means that the material is in such a state that the material itself is not decomposed. The thermal decomposition temperature varies depending on the material used. The phrase "having at least one kind of liquid crystal state" means that a material having at least one kind of liquid crystal state is used. For example, in the smectic liquid crystal phase (hereinafter, also referred to as Sm) described later, there are plural kinds of liquid crystal states such as SmA phase, SmB phase, SmC phase, etc., and the material referred to the above is meant to have at least one of such liquid crystal states.

The liquid crystalline organic semiconductor material can be divided into: an organic semiconductor material having at least one kind of thermotropic liquid crystal state; and an organic semiconductor material having at least one kind of liotropic liquid crystal state. The thermotropic liquid crystal (thermotropic LC) is a substance that turns to liquid crystal in a certain temperature range, and in the present invention, the thermotropic liquid crystal includes smectic liquid crystals and nematic liquid crystals, depending on a difference in molecular arrangement. The liotropic liquid crystal (also called liotropic LC) turns to liquid crystal in presence of a solvent, and may occur upon a change in concentration, without depending on temperature, and is also called concentration transition-type liquid crystal.

Among the above-described materials, the liquid crystalline organic semiconductor material is preferably a material having the smectic liquid crystal state of rod shape. Since the liquid crystal have self-assembling function, a molecular regularity is spontaneously formed. Particularly, the organic semiconductor layer 14, formed by using the liquid crystalline organic semiconductor material having such smectic liquid crystal phase state, can exhibit excellent charge transport property as molecular crystal. From this point of view, the organic semiconductor layer 14 is preferably formed from the liquid crystalline organic semiconductor material having high-order smectic phase state.

Such organic semiconductor layer 14 formed from the liquid crystalline organic semiconductor material have a remarkable effect concerning the charge transfer property that it exhibits high speed charge transport ability for both of the electron and the hole, based on a hopping conductivity. That is, the liquid crystal molecule constituting the organic semiconductor layer 14, causes self-assembling by the existence of the chain molecule such as alkyl, which is introduced on one end or on both ends of the skeletal structure, and is aligned in an extreme regularity. Therefore, by the liquid crystal molecule, a region, which is a molecular aggregated part having high self-assembling property, is formed in the organic semiconductor layer 14. In the region, a skeletal structure part, having π-electron aromatic ring, of the liquid crystal molecule is adjacent to adjacent molecules in extremely short distance. As a result, in the region of the liquid crystal molecule, since an overlap of the π-electron orbit becomes larger, high speed electron conduction and high speed hole conduction occur due to the hopping conduction. Therefore, the formed organic semiconductor layer exhibits high charge transport property. A distance between the skeletal structures in this case is around 0.3 to 0.5 nm. In the formed organic semiconductor layer, the hopping conduction of the electron and the hole easily occur since the layer has a region, in which rigid π-electron aromatic rings are overlapped continuously for considerably long distance, due to the self-assembling of the liquid crystal molecule. In contrast, in case of the organic semiconductor in which high molecular regularity is not realized for a long distance, such as a fine crystal, traps are generated at grain boundaries, and high conductivity cannot be expected.

On the other hand, the organic semiconductor layer 14 exhibiting the smectic liquid crystal phase has a region in which chain structure is rich. This region acts as a buffer layer isolating a layer, which is the charge transporting path, of the above-described region (the region which is a molecular aggregated part having high self-assembling property due to the liquid crystal molecule), and has an effect of exhibiting a high charge transport anisotropy.

As specific examples of the liquid crystal molecule having the smectic liquid crystal phase state, the following liquid crystal molecules can be listed as examples: 2-(4'-octylphenyl)-6-dodecyloxynaphthalene (abbreviated as 8-PNP-O12) of the following chemical formula 39 and 2-(4'-octylphenyl)-6-butyloxynaphthalene (abbreviated as 8-PNP-O4) of the following chemical formula 40 having phenylnaphthalene skeleton; didodecylterthiophene of the following chemical formula 41 and dihexylterthiophene of the following chemical formula 42 having terthiophene skeleton; and 2-(4'-heptyloxyphenyl)-6-dodecylthicbenzothiazole of the following chemical formula 43 having phenylbenzothiazole skeleton. The liquid crystalline organic semiconductor material comprising these liquid crystal molecules, in the same phase, have both of the electron transportability and the hole transportability (that is, having bipolarity of transportation). And in neither of the transportability, the charge carrier mobility by the hopping conduction depends on the field intensity nor the temperature.

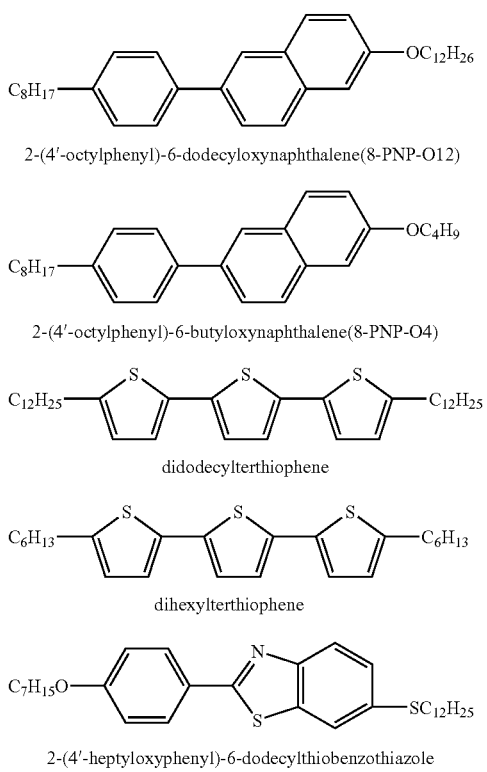

2-(4'-octylphenyl)-6-dodecyloxynaphthalene(8-PNP-O12)

2-(4'-octylphenyl)-6-butyloxynaphthalene(8-PNP-O4)

didodecylterthiophene dihexylterthiophene 2-(4'-heptyloxyphenyl)-6-dodecylthiobenzothiazole The organic semiconductor layer formed from the organic semiconductor material having at least one kind of the thermotropic liquid crystal state (hereinafter, this may be referred to as organic semiconductor material I) is formed by keeping the organic semiconductor material I at a temperature where it can maintain or go through a thermotropic liquid crystal phase, and then cooling the material from the temperature. When the cooling is carried out rapidly (that is, cooling rapidly), the organic semiconductor layer, in which a phase (preferably a smectic phase) having a high-order structure (high texture) is fixed in a glassy state, can be obtained. Moreover, when the cooling is carried out slowly (that is, cooling slowly), the organic semiconductor layer having high regularity, in which at least a part is in the crystal state, can be obtained. In the organic semiconductor layer thus formed, the crystal size of the organic semiconductor material is increased, so that high charge carrier mobility can be obtained. Particularly, when the crystal size is greater than the distance between electrodes that are involved with charge transfer, higher charge carrier mobility can be realized. In this specification, "crystal phase" or "crystal state" means that the liquid crystalline organic semiconductor material is in an aggregated state of below liquid crystal/crystal phase transition temperature.

The organic semiconductor layer formed from the organic semiconductor material having at least one kind of the lyotropic liquid crystal (hereinafter, this may be referred to as organic semiconductor material I) is formed by keeping the organic semiconductor material II at a concentration where it exhibits the lyotropic liquid crystal phase, and then, gradually removing a solvent. The organic semiconductor layer formed in this manner has an excellent alignment state so that high alignment in a broad range is realized. By gradually removing a solvent from the organic semiconductor material, high charge carrier mobility can be realized and exhibits high charge carrier mobility.

The organic semiconductor material I can be coated as it is because the material has fluidity at a temperature where the liquid crystal state is maintained. Also, the organic semiconductor material II can be coated as it is because the material has fluidity before the solvent is removed. According to these methods, an organic semiconductor layer of large area, with uniform charge carrier mobility, can be formed extremely easily. As coating methods in this case, in addition to coating methods such as spin coating method and dye coating method, printing methods such as ink jet method can be used. When the organic semiconductor material I is used to form the organic semiconductor layer, a solution, of which the organic semiconductor material I is diluted with a solvent, can be coated. In this case, depending on the drying condition of the solvent, various morphology may occur on the coated film. However, membranous of the organic semiconductor layer can be uniformed by subjecting to a heat annealing treatment, utilizing liquid crystallinity, after the coating. The thickness of the organic semiconductor layer 14 is around 0.05 to 1.0 μm.

In the organic semiconductor device 10 of the present invention, the organic semiconductor layer 14 preferably exhibits the charge carrier mobility of $10^{-6}$ cm$^2$/V·s or higher.

Figure 2:
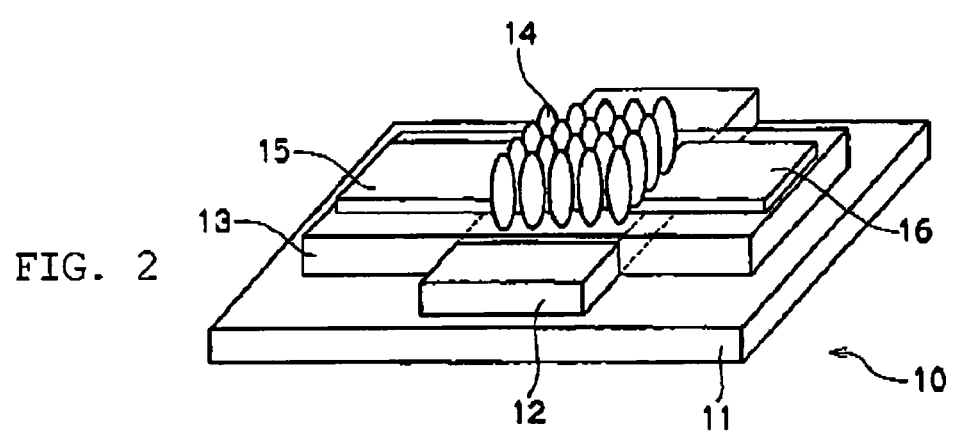
FIG. 2 is a perspective view showing one example of alignment embodiment of a liquid crystal molecule in the organic semiconductor device of the present invention.
Figure 3:
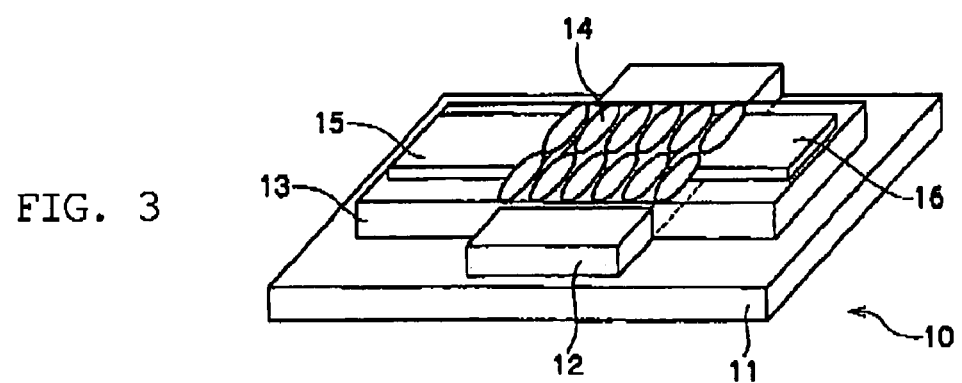
FIG. 3 is a perspective view showing one example of alignment embodiment of a liquid crystal molecule in the organic semiconductor device of the present invention.

Since the liquid crystal molecule is easily aligned in a specific direction, in the organic semiconductor layer, the liquid crystal molecule can be aligned regularly as the molecular crystal, and an average value of the distance between the molecules of the liquid crystal molecule within a molecular layer deriving from the smectic phase can be as small as 0.3 to 0.4 nm. As the alignment embodiments of the liquid crystal molecule, there are embodiments such as: (a) as shown in the FIG. 2, an embodiment in which the liquid crystal molecule is aligned in parallel to a film thickness direction of the drain electrode 16 and the source electrode 15 formed on the gate-insulating layer 13; or (b) as shown in the FIG. 3, an embodiment in which the liquid crystal molecule is aligned in orthogonal to a film thickness direction of the drain electrode 16 and the source electrode 15 formed on the gate-insulating layer 13, also standing abreast in between the drain electrode 16 and the source electrode 15. The alignment means of the liquid crystal molecule includes: a means in which a liquid crystal alignment layer is formed on a base material (for example, the surface of a gate-insulating layer 13) on which the organic semiconductor material 14 is to be formed; a means in which an alignment treatment such as rubbing treatment is carried out; and a means in which the organic semiconductor material is brought into contact with a layer subjected to an alignment treatment. The organic semiconductor layer, in which the crystal state is formed with such distance between the molecules, has effects that electron correlation between the molecules is extremely strong, hopping probability of a carrier is high, and exhibits high charge transport property. For example, when the average value of the distance between the molecules of the liquid crystal molecule, having the smectic liquid crystallinity, of the above chemical formula 25 is 0.3 to 0.4 nm, the layer has high charge transport property, that is mobility of $10^{-3}$ to $10^{-2}$ cm$^2$/V·s.

(Charge Carrier Injection Promoting Layer)

The charge carrier injection promoting layers 17 and 18 are provided in between the organic semiconductor layer 14 and at least one electrode of the source electrode 15 and the drain electrode 16, and act to reduce the difference between the work function of the electrodes 15, 16 and the work function of the organic semiconductor layer 14. That is, the charge carrier injection promoting layers 17 and 18 act to reduce a charge carrier injection barrier present between the organic semiconductor layer 14 and at least one electrode of the source electrode 15 and the drain electrode 16. By this action, the injection of charge from the electrode into the organic semiconductor layer is easily accelerated.

The charge carrier injection promoting layer is normally provided on the side of the source electrode 15, which injects the charge. When the organic semiconductor layer 14 acts as the hole transporting path, the charge carrier injection promoting layer 17 formed on the source electrode 15 side can have a function as a layer which makes the hole to be injected from the source electrode 15 to the organic semiconductor layer 14 easier. Moreover, when the organic semiconductor layer 14 acts as the electron transporting path, the charge carrier injection promoting layer 17 formed on the source electrode 15 side can have a function as a layer which makes the electron to be injected from the source electrode 15 to the organic semiconductor layer 14 easier.

Preferably, the charge carrier injection promoting layer is also provided on the drain electrode 16 side. When the charge carrier injection promoting layer 18 provided on the drain electrode 16 side is the same type as the charge carrier injection promoting layer 17 provided on the source electrode 15 side (that is, when both the charge carrier injection promoting layers 17 and 18 are layers for promoting injection of the hole, or when both the charge carrier injection promoting layers 17 and 18 are layers for promoting injection of the electron), the function of the source electrode 15 and the drain electrode 16 may be converted to each other, whereby the organic semiconductor device 10 can be utilized for insertion and extraction of the charge to a load connected to the device. On the other hand, when the charge carrier injection promoting layer 18 provided on the drain electrode 16 side is a different type from the charge carrier injection promoting layer 17 provided on the source electrode 15 side (that is, when one of the charge carrier injection promoting layers 17 and 18 is a layer for promoting injection of the hole and the other is a layer for promoting injection of the electron), the organic semiconductor device 10 can be operated with a low electric current.

The charge carrier injection promoting layer used in the present invention is an organic thin film having a dipole moment. Such organic thin film is formed from an organic compound having an electric dipole moment.

First, the case where the charge carrier injection promoting layer acts as a layer for promoting injection of the hole is described. Hereinafter, the charge carrier injection promoting layer for promoting injection of the hole is also referred to as "hole injection promoting layer".

The hole injection promoting layer is formed from an organic compound having an electric dipole moment represented by a vector having an absolute value of 1 Debye or higher and 50 Debye or lower, and a direction of the vector is directed such that a positive electrode of the organic compound is placed at the positively biased electrode side and a negative electrode of the organic compound is placed at the organic semiconductor layer side. The positively biased electrode is an electrode into which the hole is injected, and is usually the source electrode 15. The negatively biased electrode is an electrode into which the injected holes are incorporated, and is usually the drain electrode 16. Since an electric double layer is formed by chemically bonding the organic compound, having such electric dipole moment, to the positively biased electrode, the hole can be easily injected from the positively biased electrode into the organic semiconductor layer 14.

Specifically, a hole injection promoting layer forming material (organic compound having an electric dipole moment represented by a vector having an absolute value between 1 Debye to 50 Debye) is selected according to the HOMO level of the above-described organic semiconductor layer 14. For example, the HOMO value of the organic semiconductor layer 14 formed from the liquid crystalline organic semiconductor material, comprising the liquid crystal molecule (8-PNP-O4) of the above chemical formula 40, is 6.0 eV, and the work function of the source electrode 15 formed from ITO is 4.7 ev. Accordingly, a material reducing an injection barrier of about 1.7 ev, which is an energy gap between the organic semiconductor layer and the source electrode 15, is selected.

In the present invention, for example, on the organic semiconductor layer side interface of the source electrode 15, an organic thin film having a dipole moment, where organic compounds shown in the following chemical formula 44 are assembled, is formed. In the chemical formula, Y is a linking group to a reactive group of the electrode or near the electrode, X is a substitutional group, and Ar is an aromatic hydrocarbon ring or an aromatic heterocyclic ring.

$$Y-Ar-X \qquad 44$$

In formula 44, the linking group Y binds, for example, to the surface of the source electrode 15, and these gather to form an organic thin film having a dipole moment. The "organic thin film having a dipole moment" means a thin film whose thickness corresponds to the size of one molecule. Structures represented by formula 44 may be covalently bonded partially to form a dimer, a trimer or an oligomer structure, and the thickness of this layer is the size of one molecule.

Figure 4:
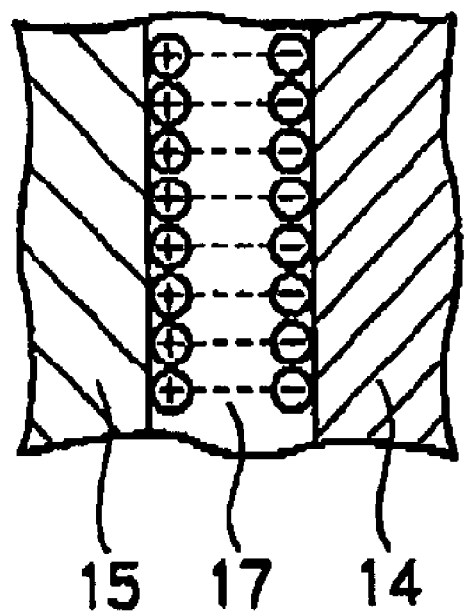
FIG. 4 is a explanatory view of a charge (hole) injection promoting layer formed on a source electrode.

The linking group Y usually reacts with, and binds to, a reactive functional group (hydroxyl group in many cases) present on the surface of the source electrode 15. FIG. 4 is an illustration wherein the organic thin film (hole injection promoting layer) 17 having a dipole moment, given by coordinating the linking group Y and the substitutional group X on both sides of Ar comprising an aromatic hydrocarbon ring or an aromatic heterocyclic ring, is formed on the surface of the source electrode 15. The work function of the source electrode 15 can be increased by an electric field due to the electric double layer possessed by the hole injection promoting layer 17.

The linking layer Y is a group having at least an oxygen atom and a halogen atom, and is selected preferably from 5 groups shown in the following chemical formula 45:

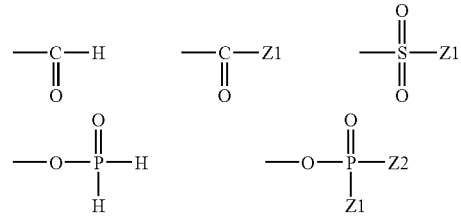

In the formula 45, Z1 and Z2 each independently represent a halogen atom, which is particularly preferably a chlorine atom.

Ar represents a divalent aromatic hydrocarbon ring or aromatic heterocyclic ring having the substitutional group X, and is preferably a divalent group having a single ring of 5 to 6 members, or 2 to 3 rings condensed therewith or bound directly thereto. Particularly, Ar is preferably benzene, naphthalene, biphenyl, anthracene, thiophene, furan, pyridine or the like.

The substitutional group X is preferably: a hydrogen atom; a halogen atom such as a chlorine atom etc.; a nitro group; a C1 to C6 alkyl group such as a methyl group, ethyl group etc.; an aralkyl group such as a benzyl group etc.; an alkenyl group such as a vinyl group etc.; a cyano group; an alkynyl group such as acetylene etc.; an amide group; an acyl group such as an acetyl group etc.; a C1 to C6 alkoxycarbonyl group such as a methoxycarbonyl group, ethoxycarbonyl group etc.; a carboxyl group; a C1 to C6 alkoxy group such as a methoxy group, ethoxy group etc.; an aryloxy group such as a phenoxy group, benzyloxy group etc.; a haloalkyl group such as a trifluoromethyl group etc.; a thiocyano group; an alkyl sulfonyl group such as a methane sulfonyl group etc.; or a sulfonamide group. The substitutional group X is selected particularly preferably from a halogen atom, haloalkyl group, cyano group and nitro group.

As the substitutional group X, an electron attracting group is particularly preferably selected from the groups described above. The electron attracting group is a substitutional group having a positive value of Hammett's constants (σm, σp). Because compound 41 whose Ar moiety is a π-conjugated system is used in the present invention, this moiety can bring out the effect of the electric double layer sufficiently without forming an insulator as in a non-conjugated linear alkyl compound.

Next, the case where the charge carrier injection promoting layer acts as a layer for promoting injection of the electron is described. Hereinafter, the charge carrier injection promoting layer for promoting injection of electrons is also referred to as "electron injection promoting layer".

The electron injection promoting layer is formed from an organic compound having an electric dipole moment represented by a vector having an absolute value of 1 Debye or higher and 50 Debye or lower, and a direction of the vector is directed such that the negative electrode of the organic compound is placed at the negatively biased electrode side and the positive electrode of the organic compound is placed at the organic semiconductor layer side. The negatively biased electrode is an electrode into which the electron is injected, and is usually the source electrode 15. The positively biased electrode is an electrode into which the injected electron is incorporated, and is usually the drain electrode 16. Since an electric double layer is formed by chemically bonding the organic compound, having such electric dipole moment, to the negatively biased electrode, the electron can be easily injected from the negatively biased electrode into the organic semiconductor layer 14.

Specifically, an electron injection promoting layer forming material having a dipole mament (organic compound having an electric dipole moment represented by a vector having an absolute value between 1 Debye to 50 Debye) is selected according to the LUMO level of the organic semiconductor layer 14. For example, the LUMO value of the organic semiconductor layer 14, formed from the liquid crystalline organic semiconductor material comprising the liquid crystal molecule (8-PNP-O4) of the above chemical formula 40, is 1.6 eV, and the work function of the source electrode 15 formed from ITO is 5.0 eV. Accordingly, an injection material reducing an injection barrier of about 3.4 eV, which is an energy gap between the organic semiconductor layer and the source electrode 15, is selected.

In the present invention, for example, on the organic semiconductor layer side interface of the source electrode 15, an electron injection promoting layer 17, wherein organic compounds shown in the following chemical formula 46 are assembled, is formed.

Y'—Ar—X'  46

In formula 46, the linking group Y' binds to the surface of the electrode, and these gather to form an organic thin film having a dipole moment. In this case, "monolayer" also means a thin film whose thickness corresponds to the size of one molecule, as described above. Structures represented by formula 43 may be covalently bonded partially to form a dimer, a trimer or an oligomer structure, and the thickness of this layer is the size of one molecule.

Figure 5:
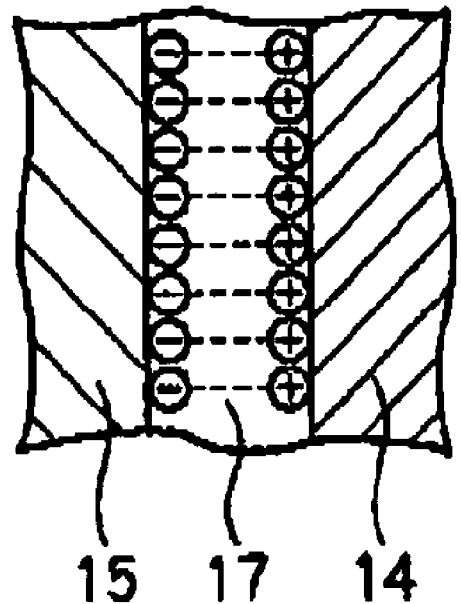
FIG. 5 is a explanatory view of a charge (electron) injection promoting layer formed on a source electrode.

The linking group Y' usually reacts with, and binds to, a reactive functional group (hydroxyl group in many cases) present on the surface of the source electrode. FIG. 5 is an illustration wherein the organic thin film (electron injection promoting layer) 17 having a dipole moment, given by coordinating the linking group Y' and the substitutional group X' on both sides of Ar comprising an aromatic hydrocarbon ring or an aromatic heterocyclic ring, is formed on the surface of the source electrode 15. The work function of the source electrode 15 can be decreased by an electric field due to the electric double layer possessed by the electron injection promoting layer 17.

The linking layer Y' is a group having at least an oxygen atom and a halogen atom, and is selected preferably from groups shown in the above chemical formula 45 as described above.

Ar represents a divalent aromatic hydrocarbon ring or aromatic heterocyclic ring having the substitutional group X, and is preferably a divalent group having a single ring of 5 to 6 members, or 2 to 3 rings condensed therewith or bound directly thereto. Particularly, Ar is preferably benzene, naphthalene, biphenyl, anthracene, thiophene, furan, pyridine or the like.

The substitutional group X' is preferably; a hydrogen atom; a halogen atom such as a chlorine atom etc.; a nitro group; a C1 to C6 alkyl group such as a methyl group, ethyl group etc.; an aralkyl group such as a benzyl group etc.; an alkenyl group such as a vinyl group etc.; a cyano group; an alkynyl group such as acetylene etc.; an amide group; an acyl group such as an acetyl group etc.; a C1 to C6 alkoxycarbonyl group such as a methoxycarbonyl group, ethoxycarbonyl group etc.; a carboxyl group; a C1 to C6 alkoxy group such as a methoxy group, ethoxy group etc.; an aryloxy group such as a phenoxy group, benzyloxy group etc.; a haloalkyl group such as a trifluoromethyl group etc.; a thiocyano group; an alkyl sulfonyl group such as a methane sulfonyl group etc.; or a sulfonamide group. The substitutional group X' is selected particularly preferably from a halogen atom, haloalkyl group, cyano group and nitro group.

As the substitutional group X', an electron attracting group is particularly preferably selected from the groups described above. The electron attracting group is a substitutional group having a negative value of Hammett's constants (σm, σp). Because compound 43 whose Ar moiety is a π-conjugated system is used in the present invention, this moiety can bring out the effect of the electric double layer sufficiently without forming an insulator as in a non-conjugated linear alkyl compound.

The charge carrier injection promoting layers 17 and 18 are provided in between the electrode and the organic semiconductor layer. Specifically, the charge carrier injection promoting layers 17 and 18 are provided on at least one electrode of the source electrode 15 and drain electrode 16, or provided in a channel region near at least one electrode of the source electrode 15 and the drain electrode 16. Here, "in a channel region near electrode" means within a region where the charge injection to the organic semiconductor layer can be promoted by being contacted to at least one part of the electrode such as an end of the electrode.

The charge carrier injection promoting layers 17 and 18 are formed on the source electrode 15 and drain electrode 16, for example prior to the formation of the organic semiconductor layer, by coating a charge carrier injection promoting layer forming solution or by deposition. In this case, the organic semiconductor layer 14 is normally formed after the charge carrier injection promoting layers 17 and 18 are formed. The composition of the charge carrier injection promoting layer forming solution, having the dipole moment, is constituted at a rate of 0.01 to 100 mmol/l.

(Interlayer-Insulating Layer)

The organic semiconductor device 10 is desirably provided with an interlayer-insulating layer. When the source electrode 15 and the drain electrode 16 are formed on the gate-insulating layer 13, the interlayer-insulating layer is formed for the purpose of preventing pollution of the surface of the gate electrode 12. Accordingly, the interlayer-insulating layer is formed on the gate-insulating layer 13 prior to the formation of the source electrode 15 and the drain electrode 16. After the source electrode 15 and the drain electrode 16 are formed, the interlayer-insulating layer is processed such that a part of the layer, disposed on the upper channel region, is completely or partially removed. The region of the interlayer-insulating layer to be removed is desirably similar to the size of the gate electrode 12.

The material constituting the interlayer-insulating layer includes inorganic materials such as silicone oxide, silicone nitride and aluminum oxide, and organic materials such as polychloropyrene, polyethylene terephthalate, polyoxymethylene, polyvinyl chloride, polyvinylidene fluoride, cyanoethyl pullulan, polymethylmethacrylate, polysulfone, polycarbonate, and polyimide.

(Organic Semiconductor Device)

In the organic semiconductor device 10 of the present invention having the above-described configuration, since the charge carrier injection promoting layers 17 and 18 are formed in between the organic semiconductor layer 14 and at least one electrode of the source electrode 15 and the drain electrode 16, the charge is injected to the organic semiconductor layer 14 easily. Particularly, when the organic semiconductor layer 14 is formed from the liquid crystalline organic semiconductor material, a sufficient quantity of the charge is supplied to this layer so that a lot of the charge is transferred at high speed in the organic semiconductor device 10. Further, in the organic semiconductor device 10, improvement of ohmic contact between the organic semiconductor layer 14/the source electrode 15 and the drain electrode 16 is required. However, in the organic semiconductor device of the present invention, since a difference between the work function of electrode and the work function of the organic semiconductor layer can be made smaller, formation of good ohmic contact can be realized. As a result, threshold voltage for operating the organic semiconductor device can be made lower.

In the above, the present invention has been described by referring to the organic transistor element of a coplanar structure shown in FIG. 1 for an example. However, the present invention can be applied to the organic transistor elements having other structures. As the organic transistor elements having other structures, for example, the organic transistor elements shown in FIG. 6 and FIG. 7 can be listed.

Figure 6:
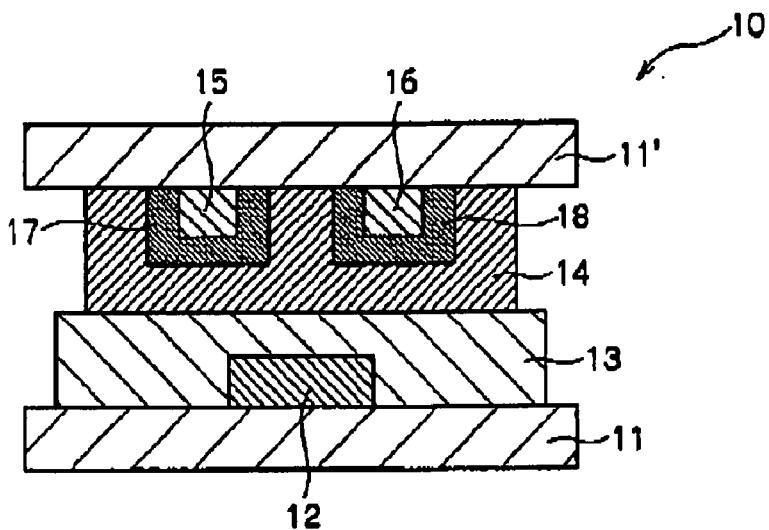
FIG. 6 is a sectional view showing another example of the organic semiconductor device of the present invention.
Figure 7:
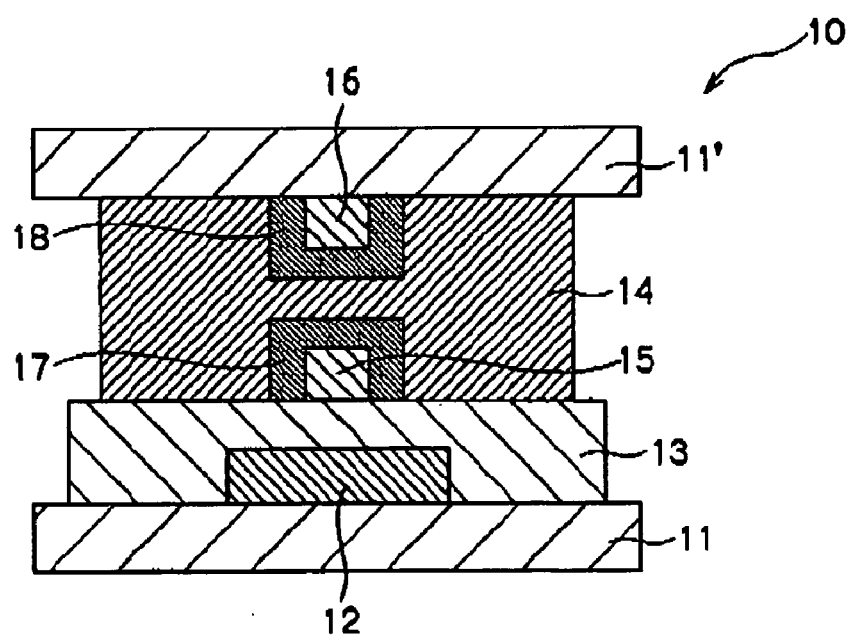
FIG. 7 is a sectional view showing another example of the organic semiconductor device of the present invention.
Figure 8:
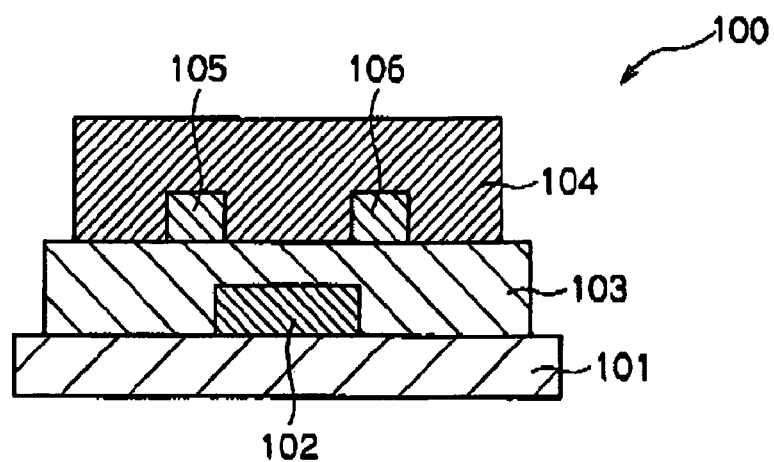
FIG. 8 is a sectional view showing one example of a conventional organic semiconductor device.

The organic transistor element shown in FIG. 6 has staggered type structure in which a first electrode 11, a gate electrode 12, a gate-insulating layer 13, an organic semiconductor layer 14, charge carrier injection promoting layers 17 and 18, a source electrode 15 and a drain electrode 16 and a second electrode substrate 11' are laminated in this order. Further, the organic transistor element shown in FIG. 7 has structure in which a first electrode 11, a gate electrode 12, a gate-insulating layer 13, a source electrode 15, a charge carrier injection promoting layer 17, an organic semiconductor layer 14, a charge carrier injection promoting layer 18, a drain electrode 16 and a second electrode substrate 11' are laminated in this order, and the charge transportation in film thickness direction of the organic semiconductor layer is utilized.

Further, in addition to triple-pole organic semiconductor device such as the organic transistor element, the present invention can be applied to double-pole organic semiconductor device such as organic diode element.

EXAMPLES

Next, the present invention is described in more detail referring to Examples. The present invention is not limited to the description of the following Examples as long as it departs the gists.

Example 1

As the organic semiconductor device in Example 1, a staggered type organic transistor element was prepared.

On a non-alkali glass substrate, (manufactured by Corning Incorporated, product number: 1737), an ITO thin film of 10 Ωcm sheet resistance was formed by sputtering method, and a pair of drains source electrode of 50 μm channel length and 1 mm channel width was formed by photolithography method. In order to inhibit non-desirable leak current deriving from conduction path, a passivation film comprising $SiO_2$ sputtering film was provided on the glass substrate, provided with the pair of drain•source electrode, by the photolithography method and lift off method so that only the organic transistor element forming region is bared.

Prior to the formation of the charge carrier injection promoting layer, the glass substrate provided with the source electrode and the drain electrode was subjected to ultrasonic cleaning with aceton, alkali detergent (manufactured by Furuuchi Chemical Corporation, Trade name: Semicoclean 56), pure water and isopropyl alcohol in this order for 10 minutes each, boiling treatment in isopropyl alcohol, and dried under condition of 30 minutes at 120 □. Further, prior to the formation of the charge carrier injection promoting layer, the glass substrate was subjected to cleaning treatment by ultraviolet and ozone for 15 minutes.

Then, a charge carrier injection promoting layer forming solution was prepared by dissolving 4-chlorophenyl-phosphorodichloridate (hereinafter, written as ClBP) to dehydrated 1,2-dichloromethane, at concentration of 5 mmol/l, dipping the cleaned glass substrate into the solution for 5 minutes, and the substrate was taken out of the solution. Then, in order to remove excess ClBP, which do not contribute to the promotion of the charge carrier injection, except for ClBP adsorbed on the drain•source electrodes and near these electrodes, the substrate was cleaned with dehydrated 1,2-dichloromethane solution, and was dried under nitrogen atmosphere. By the above-described operations, a charge carrier injection promoting layer of ClBP, mainly a monolayer, for making the hole injection to the drain•source electrodes provided on the glass substrate easier, was formed.

Next, on the charge carrier injection promoting layer formed surface of this glass substrate, an organic semiconductor material of phenylnaphthalene shown in the above chemical formula 40, 6-(4'-octylphenyl)-2-buthyloxynaphthalene (hereinafter written as 8-PNP-O4) was turned into liquid crystal state by making the temperature around 110° C., and this material was coated on the charge carrier injection promoting layer formed surface of the glass substrate by casting method. Hereinafter, a glass substrate, on which up to a coated film of an organic semiconductor layer forming solution is formed, is referred to as "substrate A".

Next, on a non-alkali glass substrate, (manufactured by Corning Incorporated, product number: 1737), a gate electrode, formed from pattern film formed tantalum, was formed by sputtering method via a metal mask. On the gate electrode formed surface of the glass substrate, photosensitive polyimide (manufactured by Toray Industries Inc., Trade name: UR-3100) was spin coated, baring the gate electrode terminals by photolithography, and calcinated to form a gate-insulating layer (thickness: 1 µm). To remove non-cured component of the photosensitive polyimide, this calcinations was carried out under condition of high vacuum at 300° C. Then, the surface of the gate-insulating layer was subjected to a rubbing treatment in orthogonal direction to a direction of which the charge is transported in the channel region. Hereinafter, a glass substrate on which up to gate-insulating layer is formed is referred to as "substrate B".

Then, the substrate A was heated to 150° C. on a hot plate, the coated film of the organic semiconductor layer forming solution of the substrate A was melted, and then, the coated film formed surface of the substrate A and the gate-insulating layer formed surface of the substrate B were superimposed according to the electrode position. Next, the superimposed substrate A and substrate B were cooled while pressed by a pressure jig. The pressuring condition at this was 150° C., pressure force of 1.5 atm and pressure time of 30 minutes.

As described above, the organic semiconductor device in Example 1 (organic transistor element of staggered type electrode configuration) was obtained. The organic semiconductor layer of the organic semiconductor device exhibited crystal phase at room temperature. As a result of electrostatic capacity measurement of the organic semiconductor device, thickness of the organic semiconductor layer was around 0.5 µm.

Example 2

As the organic semiconductor device in Example 2, an organic transistor element of coplanar type electrode configuration was prepared.

First, on a high-doped n-type silicone substrate, 300 nm of $SiO_2$ layer was formed by heat oxidation, and a gate electrode substrate provided with a gate-insulating layer was obtained. This gate electrode substrate serves as both a gate electrode and a substrate. Next, on the gate-insulating layer formed surface of the substrate, an ITO thin film of 10 Ωcm sheet resistance was formed by sputtering method, and a pair of drain•source electrode of 50 µm channel length and 1 mm channel width was formed by photolithography method. A passivation film was provided on the glass substrate, provided with the pair of drain•source electrode, by the same way as Example 1.

After cleaning the gate electrode substrate, provided with the source electrode and the drain electrode, by the same way as Example 1, a charge carrier injection promoting layer of ClBP, mainly a monolayer, for making the hole injection to the drain•source electrodes formed side surface of the gate electrode substrate easier, was formed by the same way as Example 1.

Next, on the charge carrier injection promoting layer formed surface of this gate electrode substrate, an organic semiconductor layer was formed by depositing 8-PNP-O4 via a metal mask, thereby an organic semiconductor device of Example 2 (an organic transistor element of coplanar type electrode configuration) was obtained. The organic semiconductor layer of the organic semiconductor device exhibited crystal phase at room temperature. As a result of analyzing the organic semiconductor layer by X-ray diffraction, it was confirmed that the liquid crystal molecule constituting this organic semiconductor layer is aligned in vertical to the gate electrode substrate Example 3

As the organic semiconductor device in Example 3, an organic transistor element, in which the charge is transported in a direction of a thickness of the organic semiconductor layer, was prepared.

First, by the same way as Example 2, a gate electrode substrate provided with a gate-insulating layer was obtained. Next, on the gate-insulating layer formed surface of the substrate, an ITO thin film of 10 Ωcm sheet resistance was formed by sputtering method to form a source electrode. A passivation film was provided on the glass substrate provided with the source electrode, by the same way as Example 1.

After cleaning the gate electrode substrate provided with the source electrode, by the same way as Example 1, a charge carrier injection promoting layer of ClBP, mainly a monolayer, for making the hole injection to the drain•source electrodes formed side surface of the gate electrode substrate easier, was formed by the same way as Example 1. Further, by the same way as Example 1, the coated film of the organic semiconductor layer forming solution was formed on the charge carrier injection promoting layer formed surface of the gate electrode substrate. Hereinafter, a gate electrode substrate, on which up to the coated film of the organic semiconductor layer forming solution is formed thereon, is referred to a "substrate C".

Next, on a non-alkali glass substrate, (manufactured by Corning Incorporated, product number: 1737), an ITO thin film of 10 Ωcm sheet resistance was formed by sputtering method to form a drain electrode. Hereinafter, a glass substrate, on which the drain electrode is formed thereon, is referred to a "substrate B".

Then, the substrate C was heated to 150° C. on a hot plate, the coated film of the organic semiconductor layer forming solution of the substrate C was melted, and then, the coated film formed surface of the substrate C and the gate-insulating layer formed surface of the substrate D were superimposed according to the electrode position. Next, The superimposed substrate C and substrate D were cooled while pressed by a pressure jig under the same condition as Example 1.

As described above, the organic semiconductor device in Example 1 (organic transistor element in which the charge is transported in a direction of a thickness of the organic semiconductor layer) was obtained. The organic semiconductor layer of the organic semiconductor device exhibited crystal phase at room temperature. As a result of electrostatic capacity measurement of the organic semiconductor device, thickness of the organic semiconductor layer was around 0.5 μm.

Example 4

As the organic semiconductor device in Example 4, an organic diode element was prepared.

On each of two substrates (manufactured by Corning Incorporated, product number: 1737), an ITO thin film of 10 Ωcm sheet resistance was formed by sputtering method to prepare two substrates provided with the electrode. After cleaning one of the substrate by the same way as Example 1, a hole injection promoting layer of ClBP, mainly a monolayer, was formed by the same way as Example 1. Further, by the same way as Example 1, the coated film of the organic semiconductor layer forming solution was formed on the hole injection promoting layer formed surface of the gate electrode substrate. Hereinafter, a substrate, on which up to the coated film of the organic semiconductor layer forming solution is formed thereon, is referred to a "substrate E".

The other substrate was cleaned by the same way as Example 1. Then, an electron injection promoting layer forming solution was prepared by dissolving fluorenylmethyl chloroformate (hereinafter, written as FCCL) to dehydrated 1,2-dichloromethane, at concentration of 1 mmol/l, dipping the cleaned substrate into the solution for 5 minutes, and the substrate was taken out of the solution. By the above-described operations, an electron injection promoting layer of FCCL, mainly a monolayer, was formed. Hereinafter, a substrate, on which up to the electron injection promoting layer is formed thereon, is referred to a "substrate F".

Then, the substrate E was heated to 150° C. on a hot plate, the coated film of the organic semiconductor layer forming solution of the substrate E was melted, and then, the coated film formed surface of the substrate E and the electron injection promoting layer formed surface of the substrate F were superimposed according to the electrode position. Next, the superimposed substrate E and substrate F were cooled while pressed by a pressure jig under the same pressuring condition as in Example 1. As described above, the organic semiconductor device in Example 4 (organic diode element) was obtained.

Comparative Example 1

An organic semiconductor device in Comparative Example 1 was obtained by the same way as Example 1 except that the charge carrier injection promoting layer is not formed in the preparation of the organic semiconductor device in Example 1. The organic semiconductor layer of the organic semiconductor device exhibited crystal phase at room temperature. As a result of electrostatic capacity measurement of the organic semiconductor device, thickness of the organic semiconductor layer was around 0.5 μm.

Comparative Example 2

An organic semiconductor device in Comparative Example 2 was obtained by the same way as Example 2 except that the charge carrier injection promoting layer is not formed in the preparation of the organic semiconductor device in Example 2. The organic semiconductor layer of the organic semiconductor device exhibited crystal phase at room temperature. As a result of analyzing the organic semiconductor layer by X-ray diffraction, it was confirmed that the liquid crystal molecule constituting this organic semiconductor layer is aligned in vertical to the gate electrode substrate.

Comparative Example 3

An organic semiconductor device in Comparative Example 3 was obtained by the same way as Example 3 except that the charge carrier injection promoting layer is not formed in the preparation of the organic semiconductor device in Example 3. The organic semiconductor layer of the organic semiconductor device exhibited crystal phase at room temperature. As a result of electrostatic capacity measurement of the organic semiconductor device, thickness of the organic semiconductor layer was around 0.5 μm.

(Measurement of Work Function and XPS of Charge Carrier Injection Promoting Layer)

Work function of the following electrodes were measured: an electrode provided with a charge carrier injection promoting layer, for making the hole injection easier, formed from ClBP; and an electrode not provided with such charge carrier injection promoting layer.

First, a glass substrate provided with an ITO electrode was cleaned by the same way as Example 1 to 4. Hereinafter, a glass substrate provided with an ITO electrode is referred to as "glass substrate G". Next, a charge carrier injection promoting layer forming solution was prepared by the same way as Example 1 to 4. Using this solution, a charge carrier injection promoting layer of ClBP, mainly a monolayer, was formed on 1 cm diameter circular region of the ITO electrode formed on the glass substrate G.

An ionization potential of the ITO electrode provided with the charge carrier injection promoting layer was measured with AC-1 (atmosphere type ultraviolet photoelectron spectrometer, Riken Keiki Co., LTD). Moreover, an ionization potential of the ITO electrode provided on the glass substrate G (the charge carrier injection promoting layer is not formed) was measured by the same way. As a result, the work function of the electrode not provided with the charge carrier injection promoting layer was 5.0 eV. In contrast, the work function of the electrode provided with the charge carrier injection promoting layer was 5.5 eV.

The existence of the charge carrier injection promoting layer was confirmed by XPS (X-ray photoelectron analyzer). As a result, each element of Cl (chlorine) and P (phosphorus) arising from Cl3P was confirmed, and it was confirmed that the charge carrier injection promoting layer is formed on the ITO electrode.

(Property Evaluation of Organic Semiconductor Device)

Using the organic semiconductor device in Examples and Comparative Examples, gate voltage-drain current property, when drain-source voltage is constantly maintained, was evaluated by applying voltage between gate electrode and source electrode-drain electrode. The temperature condition of the measurement was a temperature (90° C.) at which 8-PNP-O4 constituting the organic semiconductor layer exhibits the smectic liquid crystal phase (SmE phase), and room temperature (30° C.).

Figure 9:
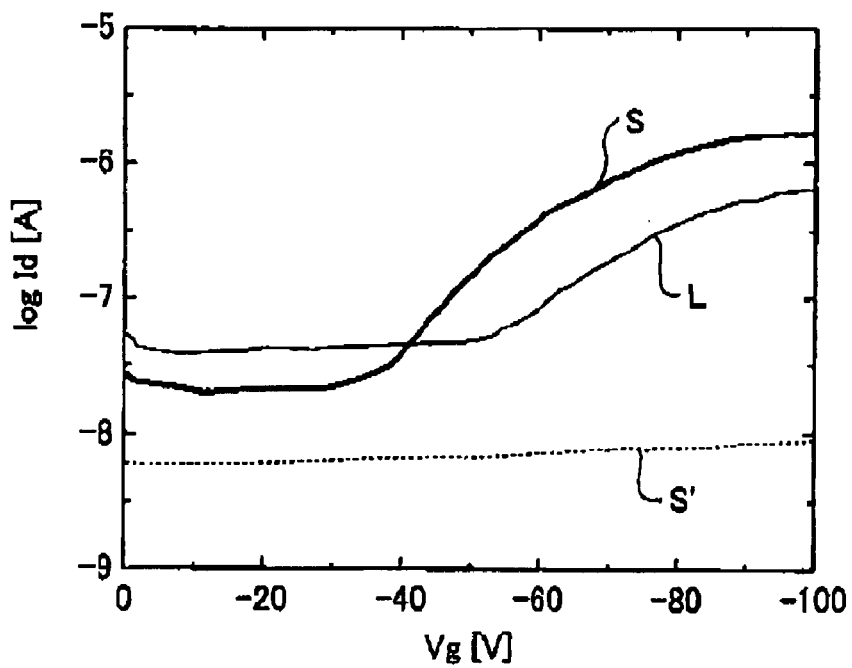
FIG. 9 is a graph showing gate voltage-drain current property in the organic semiconductor device in Example 1 and Comparative Example 1.
Figure 10:
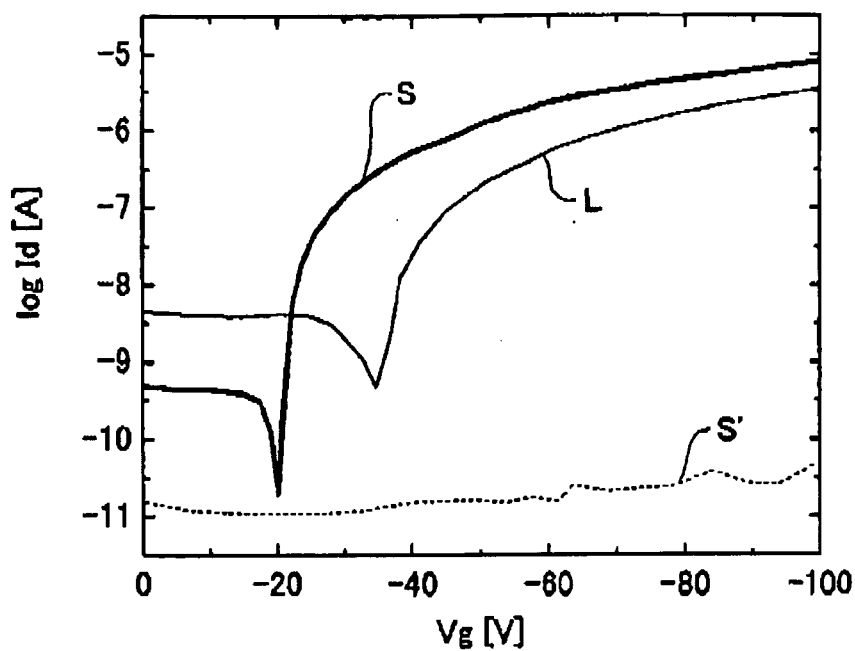
FIG. 10 is a graph showing gate voltage-drain current property in the organic semiconductor device in Example 2 and Comparative Example 2.
Figure 11:
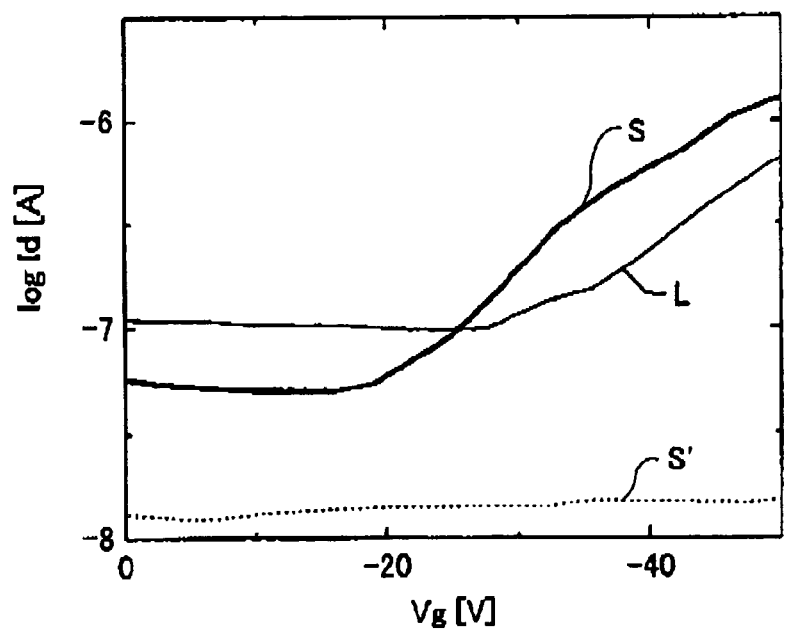
FIG. 11 is a graph showing gate voltage-drain current property in the organic semiconductor device in Example 3 and Comparative Example 3.

FIG. 9 is a graph showing gate voltage (Vg)-drain current (Id) property in the organic semiconductor device in Example 1 and Comparative Example 1, FIG. 10 is a graph showing gate voltage-drain current property in the organic semiconductor device in Example 2 and Comparative Example 2, and FIG. 11 is a graph showing gate voltage-drain current property in the organic semiconductor device in Example 3 and Comparative Example 3. Moreover, S in FIG. 9 to FIG. 11 shows results of the organic semiconductor device in each Example at room temperature, L in FIG. 9 to FIG. 11 shows results of the organic semiconductor device in each Example at 90° C., and S' in FIG. 9 to FIG. 11 shows results of the organic semiconductor device in each Comparative Example at room temperature.

As apparent from S and S' in FIG. 9, in the organic semiconductor device in Comparative Example 1 which is not provided with the charge carrier injection promoting layer, when drain-source voltage is −100V, drain current variation was not observed even though −100V of gate voltage is applied. In contrast, in the organic semiconductor device in Example 1, drain current variation of about 2 digits current value was observed in a threshold voltage range of −30V to −100V, and it was confirmed that the charge carrier injection is improved by introducing the charge carrier injection promoting layer at near the source electrode.

Further, in the organic semiconductor device in Example 1, threshold voltage of the organic semiconductor layer exhibiting SmE liquid crystal phase was −48V. In contrast, threshold voltage of the organic semiconductor layer exhibiting crystal phase was −35V. Further, field effect mobility of the organic semiconductor layer exhibiting SmE liquid crystal phase was $7 \times 10^{-3}$ cm$^2$/V·s. In contrast, field effect mobility of the organic semiconductor layer exhibiting crystal phase was $1.2 \times 10^{-2}$ cm$^2$/V·s. By this, improvement of the charge transport property in the organic semiconductor layer exhibiting the crystal phase, which is formed by going through the liquid crystal phase, was confirmed. The threshold voltage and field effect mobility was obtained from precipitation of gate voltage-drain current in FIG. 9.

As apparent from S and S' in FIG. 10, in the organic semiconductor device in Comparative Example 2 which is not provided with the charge carrier injection promoting layer, when drain-source voltage is −100V, drain current variation was not observed even though −100V of gate voltage is applied. In contrast, in the organic semiconductor device in Example 2, drain current variation of about 4 digits current value was observed in a threshold voltage range of −20V to −100V, and it was confirmed that the charge carrier injection is improved by introducing the charge carrier injection promoting layer at near the source electrode.

Further, in the organic semiconductor device in Example 2, threshold voltage of the organic semiconductor layer exhibiting SmE liquid crystal phase was −35V. In contrast, threshold voltage of the organic semiconductor layer exhibiting crystal phase was −20V. Further, field effect mobility of the organic semiconductor layer exhibiting SmE liquid crystal phase was $3 \times 10^{-3}$ cm$^2$/V·s. In contrast, field effect mobility of the organic semiconductor layer exhibiting crystal phase was $1.3 \times 10^{-2}$ cm$^2$/V·s. By this, improvement of the charge transport property in the organic semiconductor layer exhibiting the crystal phase, which is formed by going through the liquid crystal phase, was confirmed.

As apparent from S and S' in FIG. 11, in the organic semiconductor device in Comparative Example 3 which is not provided with the charge carrier injection promoting layer, drain current variation was not observed when drain-source voltage is maintained at −50V and 50V of gate voltage is applied. In contrast, in the organic semiconductor device in Example 3, drain current variation was observed when the threshold voltage is −20V or higher, and it was confirmed that the charge injection is improved by introducing the charge carrier injection promoting layer at near the source electrode. Moreover, improvement of the charge transport property in the organic semiconductor layer exhibiting the crystal phase, which is formed by going through the liquid crystal phase, was confirmed.

What is claimed is:

1. An organic semiconductor device comprising a first electrode and a second electrode facing to each other, and an organic semiconductor layer provided in between the first electrode and the second electrode, wherein a charge carrier injection promoting layer is formed in between the organic semiconductor layer and at least one electrode of the first electrode and the second electrode.

2. The organic semiconductor device according to claim 1, wherein the organic semiconductor layer is formed from a liquid crystalline organic semiconductor material.

3. The organic semiconductor device according to claim 2, wherein the liquid crystalline organic semiconductor material comprises a liquid crystal molecule shown in a following chemical formula 1:

(Wherein A in the above chemical formula represents a core part having skeletal structure comprising L-unit of 6π-electron system ring, M-unit of 8π-electron system ring, N-unit of 10π-electron system ring, O-unit of 12π-electron system ring, P-unit of 14π-electron system ring, Q-unit of 16π-electron system ring, R-unit of 18π-electron system ring, S-unit of 20π-electron system ring, T-unit of 22π-electron system ring, U-unit of 24π-electron system ring and V-unit of 26π-electron system ring (Wherein L, M, N, O, P, Q, R, S, T, U and V each represent an integer of 0 to 12, and L+M+N+O+P+Q+R+S+T+U+V=1 to 12.), and B and B' in the above chemical formula represent a chain structure with high flexibility or functional group such as hydrogen and halogen.)

4. The organic semiconductor device according to claim 2, wherein the liquid crystalline organic semiconductor material has at least one of a thermotropic liquid crystal phase state and a lyotropic liquid crystal phase state.

5. The organic semiconductor device according to claim 3, wherein the liquid crystalline organic semiconductor material has at least one of a thermotropic liquid crystal phase and a lyotropic liquid crystal phase.

6. The organic semiconductor device according to claim 4, wherein the thermotropic liquid crystal phase is a smectic liquid crystal phase.

7. The organic semiconductor device according to claim 5, wherein the thermotropic liquid crystal phase is a smectic liquid crystal phase.

8. The organic semiconductor device according to claim 1, wherein the organic semiconductor layer exhibits a charge carrier mobility of at least $10^{-6}$ cm$^2$/V·s.

9. The organic semiconductor device according to claim 1, wherein the charge carrier injection promoting layer is an organic thin film having a dipole moment.

10. The organic semiconductor device according to claim 1, wherein the charge carrier injection promoting layer is formed from an organic compound having an electric dipole moment represented by a vector having an absolute value in a range between 1 Debye and 50 Debye, and a direction of the vector is directed such that a positive electrode of the organic compound is placed at a hole injecting electrode side, among the first electrode and the second electrode, and a negative electrode of the organic compound is placed at the organic semiconductor layer side.

11. The organic semiconductor device according to claim 1, wherein the charge carrier injection promoting layer is formed from an organic compound having an electric dipole moment represented by a vector having an absolute value in a range between 1 Debye and 50 Debye, and a direction of the vector is directed such that a negative electrode of the organic compound is placed at an electron injecting electrode side, among the first electrode and the second electrode, and a positive electrode of the organic compound is placed at the organic semiconductor layer side.

12. The organic semiconductor device according to claim 1, wherein the charge carrier injection promoting layer is an organic thin film comprising either one of an organic compound shown in a following chemical formula 44 and an organic compound shown in a chemical formula 46:

Y—Ar—X　　44

Y'—Ar—X'　　46

(In formula 44 and formula 46, Ar represents an aromatic hydrocarbon ring or an aromatic heterocyclic ring, Y and Y' represent a linking group to a reactive group existing in or near said at least one electrode, and X and X' represent a substitutional group.)

13. The organic semiconductor device according to claim 1, wherein the first electrode is a source electrode; the second electrode is a drain electrode; the organic semiconductor layer is formed in a channel region in between the source electrode and the drain electrode; and further comprising a substrate, a gate electrode, and a gate-insulating layer.

14. The organic semiconductor device according to claim 13, wherein the source electrode and the drain electrode are formed on the substrate, and the charge carrier injection promoting layer is formed: on at least one electrode of the source electrode and the drain electrode; or in the channel region near at least one electrode of the source electrode and the drain electrode.

15. The organic semiconductor device according to claim 13, wherein the substrate is a first electrode substrate on which the source electrode is formed, further comprising a second electrode substrate on which the drain electrode is formed, and the first electrode substrate and the second electrode substrate are provided so that they face to each other, and the charge carrier injection promoting layer is formed: on at least one electrode of the source electrode and the drain electrode; or in the channel region near at least one electrode of the source electrode and the drain electrode.

\* \* \* \* \*